United States Patent [19]

Mohr

[11] Patent Number: 4,470,020

[45] Date of Patent: Sep. 4, 1984

[54] VIRTUAL GROUND PREAMPLIFIER FOR MAGNETIC PHONO CARTRIDGE

[76] Inventor: Daniel R. Mohr, 82 Half Acre Rd., Cranbury, N.J. 08512

[21] Appl. No.: 375,659

[22] Filed: May 6, 1982

[51] Int. Cl.³ .......................... H03F 1/34; G11B 5/02
[52] U.S. Cl. ................................. 330/304; 330/107; 330/265; 330/306; 330/294; 360/65; 360/67
[58] Field of Search ............ 330/107, 265, 303, 306, 330/294, 304; 360/65, 67; 381/121; 333/28 R

[56] References Cited

U.S. PATENT DOCUMENTS

| | | | |
|---|---|---|---|
| 3,007,010 | 10/1961 | Erath et al. | 360/65 |
| 3,068,327 | 12/1962 | Davidson | 360/67 |
| 3,252,098 | 5/1966 | Schlaepfer | 360/67 |
| 4,032,855 | 6/1977 | Holman | 330/109 |
| 4,041,538 | 8/1977 | Parker | 360/67 |
| 4,105,945 | 8/1978 | Sano | 330/294 |
| 4,117,412 | 9/1978 | Holman | 330/107 |
| 4,134,140 | 1/1979 | Wright | 360/67 |
| 4,159,489 | 6/1979 | Braitberg | 360/65 |
| 4,210,942 | 7/1980 | Nakamura | 360/65 |
| 4,321,553 | 3/1982 | Wagner | 330/265 |
| 4,363,001 | 12/1982 | Suzuki et al. | 330/107 |

FOREIGN PATENT DOCUMENTS 53-78801  7/1978  Japan .................................. 330/304

OTHER PUBLICATIONS

Vajda, "Low-Noise Preamplifier For Professional Audio Recorders", *Journal of the Audio Engineering Society*, vol. 23, No. 1, Jan.–Feb. 1975, pp. 14–20.

*Primary Examiner*—James B. Mullins
*Attorney, Agent, or Firm*—Richard C. Woodbridge

[57] ABSTRACT

This application discloses a virtual ground pre-amplifier for application with magnetic phono cartridges such as moving coil, moving magnet, moving iron, or similar types. The preamplifier according to the present invention comprises a forward path (an amplifier), and a reverse path (shunt feedback). By presenting a relatively low load impedance to the phono cartridge, the preamplifier effectively damps mechanical resonances of the stylus-cartridge system, and thus serves as a "stylus stabilizer."

Also disclosed are techniques for equalizing the overall response of the stylus-cartridge-preamp system so as to provide a predetermined (e.g., flat) frequency response. This predetermined frequency response can be achieved by utilizing any of several circuit arrangements which serve to compensate for the intrinsic inductance and dc resistance of the magnetic phono cartridge. A detailed description is given of a high-performance complementary-symmetry "operational-type" amplifier which is well-suited for use in the forward path of the preamplifier.

9 Claims, 11 Drawing Figures

VIRTUAL GROUND PREAMPLIFIER FOR MAGNETIC PHONO CARTRIDGE

TECHNICAL FIELD

This invention relates to phonograph playback equipment in general, and in particular to preamplifiers which accept the electrical signal produced by a magnetic phono cartridge and produce an amplified, filtered replica of this signal.

BACKGROUND OF THE INVENTION

Phono preamplifiers incorporating the RIAA network typically utilize a 47k ohm resistor, electrically connected in parallel with the preamplifier input, to present a controlled, predetermined load impedance to the magnetic phono cartridge. Some recent equipment utilizes switch-selectable resistors, typically in the range 10k ohm to 100k ohm, and also capacitive loading in the range of a few hundred picofarads, which may also be switch-selectable. These approaches represent an attempt to modify high-frequency response characteristics of the phono cartridge-preamplifier system. Many magnetic cartridges exhibit mechanical resonances which produce a peaking of the overall response characteristic at one or more frequencies in the high-audio frequency range.

The voltage output of the magnetic cartridge is dependent upon the electrical load impedance to which it is connected. In the high-audio frequency range, the output impedance of the magnetic cartridge appears substantially inductive. Thus, the capacitance of the cable which connects the magnetic phono cartridge to the preamplifier forms a parallel resonant circuit with the intrinsic inductance of the cartridge, resulting in response maximum at the resonant frequency. The canonical 47k ohm load suppresses the Q of this resonance and the combination produces a reasonably flat response over the audio range of frequencies, as can be seen from FIG. 11. If a load resistance greater than 47k ohm (e.g., 1M ohm) the mid-band output voltage is increased at the expense of frequency response. A lower impedance resistive load (i.e., lower than 47k ohm) produces even greater bandwidth, but output voltage amplitude is sacrificed. In general, then, a relatively low-resistance load can be seen to produce best frequency response, but with low output voltage amplitude and hence poor signal-to-noise.

Because of their lower moving mass, the newer moving coil type cartridges appear to have less tendency to color the sound by mechanical resonance. However, some manufacturers and audiophiles have suggested operating these relatively low impedance cartridges into load resistances of the order of 20 ohms to 100 ohms, and in some cases as low as 2 ohms, to modify the "color" of the sound.

Both the low impedance moving coil type and the high impedance moving iron or moving magnet type cartridges, by virtue of their non-zero output impedances, develop an output voltage which is related to the complex load impedance, as well as to the electrical and mechanical characteristics of the cartridge itself (and the program material, of course). The prior-art approaches to preamplifiers for these types of phono cartridges have generally utilized passive impedances (e.g., resistors, capacitors, inductors) in various degrees of compromise between the twin ideals of wideband flat frequency response, on the one hand, and low noise, on the other.

Typical of prior-art patents in related areas is U.S. Pat. No. 4,134,140, "Voltage Mode Amplifier for Use with a High Q Magnetic Head," issued to C. E. Wright et al. an Jan. 9, 1979, which discloses the use of shunt feedback in connection with a magnetic tape playback head. FIGS. 1A and 2 of this reference show the shunt feedback arrangement, and FIG. 1B illustrates the effect on the resonant peaking of the magnetic pickup head. The discussion at column 1, lines 16–36 provides a description of the design considerations involving in a preamplifier for a magnetic tape playback head.

U.S. Pat. No. 4,105,945, "Active Load Circuits," issued to N. Sano et al. on Aug. 8, 1978, describes the use of an "active load" (the components designated 13–18 in FIG. 2 of the reference) to produce, by means of negative feedback, an input impedance that is lower than the intrinsic input impedance of the equalizer amplifier. This reference does not appear to teach the advantages to be derived from a simple virtual-ground approach.

U.S. Pat. No. 4,032,855, "Phonograph Preamplifier Network with Infrasonic Cutoff Response," issued to T. M. Holman, II, on June 28, 1977, describes the use of a hybrid feedback scheme which is part series feedback, part shunt feedback. FIG. 1 and the description commencing at column 2, line 47, indicate that this invention is directed toward modifying the very low frequency ("infrasonic") response of the preamplifier.

U.S. Pat. No. 4,117,412, "Phonograph Preamplifier Network with Infrasonic Cutoff Response," issued to T. M. Holman, II, on Sept. 26, 1978, is a continuation-in-part of the same application as matured into U.S. Pat. No. 4,032,855. The claims are somewhat different, although there appears to be no additional disclosure that might be relevant to the present invention.

U.S. Pat. No. 4,210,942, "Video Signal PlayBack Circuit," issued to H. Nakamura et al. on July 1, 1980, illustrates a similar circuit arrangement as applied to the playback head of a video magnetic tape apparatus. In the schematic diagram of FIG. 2, resistor 19 appears to provide shunt feedback. Especially relevant is the discussion of signal to noise at column 1, line 62, through column 2, line 31.

U.S. Pat. No. 4,041,158, "Low Noise Magnetic Transducer Preamplifier Having Flat Response," issued to R. R. Parker on Aug. 9, 1977, is of general interest only.

Some of the considerations influencing design of low noise amplifiers generally are summarized in the article by H. P. Walker, "Low-noise Audio Amplifiers," *Wireless World*, May 1972 (pp. 233–237).

Also if interest is the article by T. Holman, "New Factors in Phonograph Preamplifier Design," *Journal of the Audio Engineering Society*, May 1972 (pp. 263–270).

SUMMARY OF THE INVENTION

It is, therefore, an object of the present invention to provide a new circuit arrangement for extracting an electrical signal from a magnetic phono cartridge by operating the cartridge into a virtual ground preamplifier. In this approach, the cartridge is presented a relatively low impedance, and only a small amplitude ac voltage is developed across the terminals of the magnetic cartridge. The dc resistance and inductance of the cartridge, in this configuration, affect frequency response of the cartridge-preamplifier system, but these effects can be compensated by a suitable selection of the shunt feedback network, or by appropriate control of the frequency response of other portions of the preamplifier (or following amplifier stages).

BRIEF DESCRIPTION OF THE DRAWINGS

A complete understanding of the present invention can be obtained from the detailed description which follows, together with the accompanying drawings, wherein:

In FIG. 2, the amplifier A1 may be, for example, the wideband inverting amplifier of FIG. 1. Of course, a conventional monolithic or hybrid integrated circuit operational amplifier may also be utilized for amplifier A1, with some sacrifice of performance. In FIG. 2, the magnetic phono cartridge is represented by its equivalent resistance 10 and inductance 11, and capacitor 12 represents cable capacitance.

In FIG. 5, amplifier A1 is the wideband inverting amplifier shown in detail in FIG. 1 or, alternatively, an integrated circuit operational amplifier. The magnetic phono cartridge is again represented by its resistance 10 and inductance 11, and capacitor 12 represents cable capacitance.

FIG. 11 illustrates the parallel resonance effect which occurs between the inductance of the phono cartridge and the cable (and other parasitic) capacitance. As can be seen from FIG. 11, the choice of load resistance can serve to effect a compromise between bandwidth and signal amplitude. Lower resistances result in greater bandwidth, but at the cost of signal amplitude and signal-to-noise ratio.

DESCRIPTION OF THE INVENTION

The present invention extracts the electrical signal from a magnetic phono cartridge by utilizing the electrical current supplied by the cartridge into the relatively low input impedance of a virtual-ground preamplifier. This arrangement provides electrical damping of the electromechanical system comprising the cantilevered stylus, the magnetic phono cartridge itself, and its electrical load.

Moreover, this circuit arrangement is capable of yielding a much wider bandwidth frequency response than the prior-art arrangement of operating the phono cartridge into a 47k ohm load resistor.

In the description that follows, the term "preamplifier" will be used to refer to the overall circuit which receives an electrical signal produced by the magnetic phono cartridge, and which produces an amplified, filtered version of this electrical signal. The preamplifier, as will be seen, invariably comprises at least one "amplifier" (as defined below) and a "shunt feedback transimpedance network" (as defined below). In some embodiments, the preamplifier may incorporate a highpass filter as well.

The term "amplifier" will be used to refer to an electronic circuit for receiving and amplifying electrical signals. Conventional operational amplifiers are comprehended as a species within the genus of this definition, "amplifier."

The term "shunt feedback transimpedance network" will be used to refer to any electrical network connected between the output and the input of an amplifier. Generally, the shunt feedback transimpedance means serves to define the output voltage of the amplifier as a function of input current supplied to the node of the shunt feedback transimpedance network that is connected to the input of the amplifier. The shunt feedback transimpedance network is a simple resistor in some embodiments; in other embodiments the shunt feedback transimpedance network is a three-terminal network.

Figure 6:
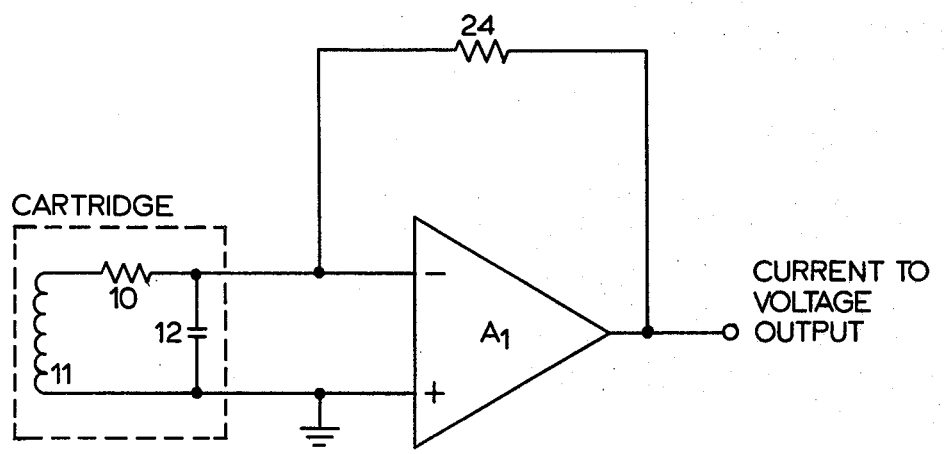
FIG. 6 is an electrical schematic diagram of a current-to-voltage converter according to the present invention. The phonograph cartridge is represented by its inductance 11 and resistance 10. Capacitor 12 represents the cable capacitance.
Figure 7:
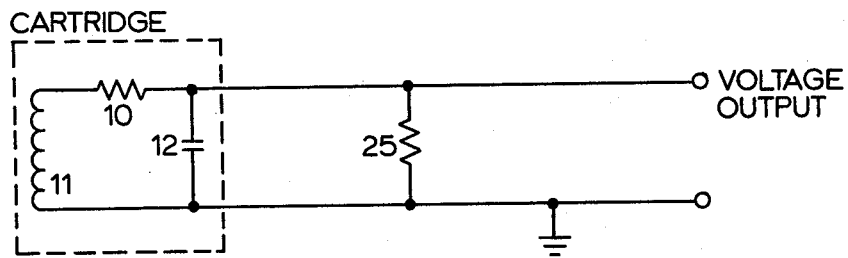
FIG. 7 is an electrical schematic diagram which illustrates the prior-art technique in which a phonograph cartridge (represented by inductance 11 and resistance 10) is connected via a cable (represented by capacitor 12) to a resistive load 25. Current flowing through resistive load 25 produces an output voltage signal. Typically, the resistive load is chosen to be 47k ohm.
Figure 8:
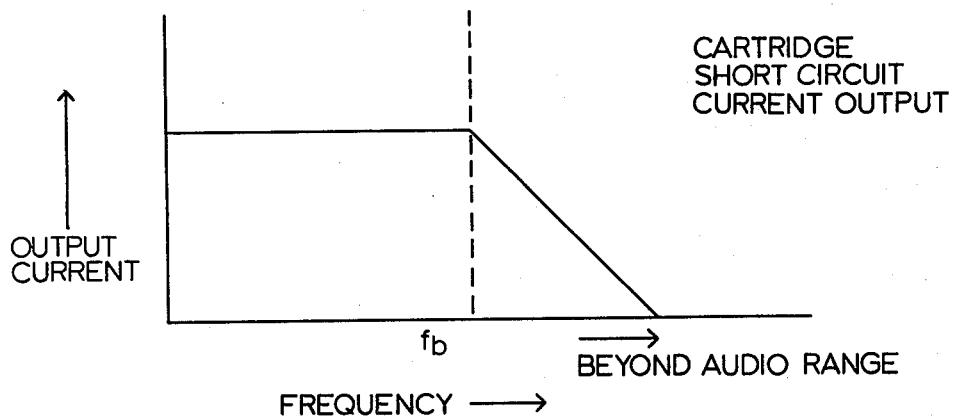
FIG. 8 is a graph illustrating the output current amplitude versus frequency of a typical magnetic phono cartridge. Because the feedback element (resistor 24) in FIG. 6 is a pure resistance, the graph of FIG. 8 also represents the output voltage amplitude of the circuit of FIG. 6 versus frequency. Note that the actual response curves are represented by their asymptotes in FIGS. 8, 9 and 10.

Equalization of frequency response can be provided, if necessary, for example in the case of high-impedance moving magnet or moving-iron cartridges. Equalization may not be necessary in the case of low-impedance moving-coil cartridges, depending upon the actual L/R characteristic of the phono cartridge. Referring to FIGS. 6 and 8, some equalization may be required if the frequency $f_b$, which is related to the inductance 11 and resistance 10 of the magnetic phono cartridge, falls so low as to result in a loss of response in the high audio frequency region. Specifically, the frequency $f_b$ is defined by $$f_b = \left[ 2\pi \frac{L_{11}}{R_{10}} \right]^{-1}, \quad (1)$$

where $R_{10}$ represents the resistance 10 of the magnetic phono cartridge, and $L_{11}$ represents the inductance 11 of the magnetic phono cartridge.

The following disclosure of the present invention is directed to a preferred embodiment of the circuit which has been developed, tested and used in high fidelity sound systems incorporating magnetic phono cartridges of all three types. As will be recognized by those skilled in the art, variations of certain particulars of the amplifiers used, and the compensation techniques used in the shunt feedback transimpedance network, together with passive or active filters following the amplifier, may be utilized to accomplish the objectives of the invention. Particular components or component values are specified merely by way of example, and without limitation to the scope of the invention as set forth in the claims.

The description of the invention consists of two parts:

1. First, the technique for realizing the objectives of the invention are described, utilizing a "operational-type" amplifier, without regard to the characteristics of the amplifier itself. In this connection, it should again be noted that the term "amplifier" is intended to define genus that is broader than the conventional device usually termed as "operational-amplifier." In particular, the amplifier may be designed for low intrinsic input impedance. It need not be restricted to a 6 dB/octave (20 dB/decade) open-loop frequency response, nor is it necessarily characterized by an open-loop phase of approximately 90° throughout the frequency range of interest.

2. The description of the invention concludes with a detailed description of one particular amplifier, together with a summary of design considerations and typical component values.

The first embodiment of the invention, illustrated in FIG. 2, while not the preferred embodiment, will be discussed first in order to clarify the basic principles of the invention. The ciruit of FIG. 2 will be described in connection with a typical magnetic phono cartridge, the Shure V15, type III. The manufacturer specifies the dc resistance (represented by resistor 10 in FIG. 2) of this magnetic phono cartridge as 1.35k ohms, and its inductance (represented by inductor 11 in FIG. 2) as 500 mH.

The internal structure of the amplifier of FIG. 1, which may be utilized for amplifier A1 in FIG. 2, will be described later. It will be understood that a conventional monolithic or hybrid integrated circuit operational amplifier may, alternatively, be used for amplifier A1, with some sacrifice of performance.

Figure 2:
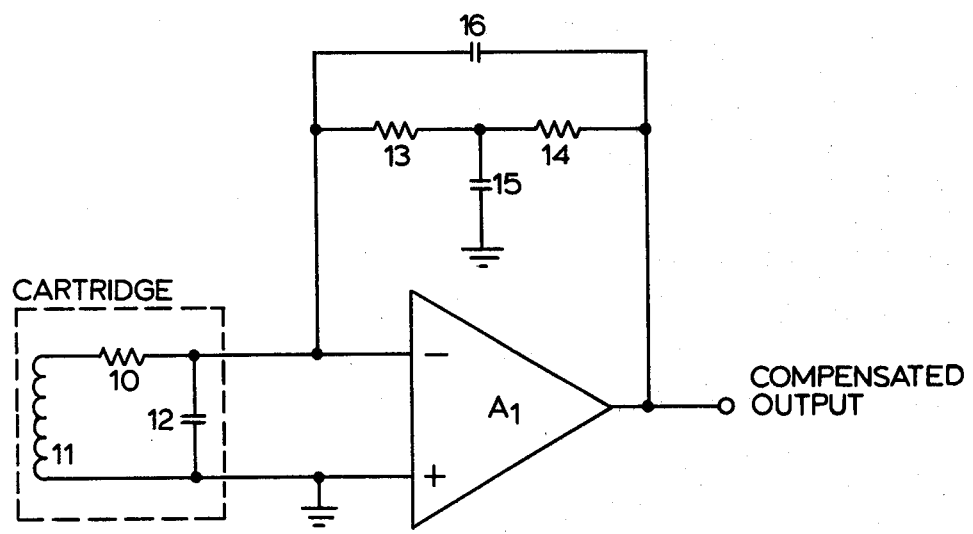
FIG. 2 is an electrical schematic diagram of a first embodiment of the invention, in which the feedback, or compensation, network is of the form of a bridged-tee configuration.

The shunt feedback transimpedance network shown in FIG. 2, comprises resistor 13, resistor 14, capacitor 15, and capacitor 16. It will be noted that the shunt feedback transimpedance network is electrically connected between the output and the inverting input of amplifier A1. This is not to imply that the shunt feedback transimpedance network is restricted to two-terminal networks. In fact, the feedback network illustrated in FIG. 2 is a three-terminal network, and other variations will be apparent to the worker familiar with the art.

In the embodiment of FIG. 2, resistor 13 and resistor 14 are chosen such that each is one-half the resistance 10 of the magnetic phono cartridge. For the Shure V15, type III cartridge, this criterion results in values of 675 ohms for R13 and 675 ohms for R14, thereby producing a dc feedback resistance (R13 plus R14) equal to the resistance 10 of the magnetic phono cartridge, resulting in unity voltage gain from dc through $f_b$, the frequency determined by the L/R constant of the magnetic phono cartridge (refer to Equation 1, supra). The frequency $f_b$, in the case of the Shure V15, type III magnetic phono cartridge, is readily found to be approximately 430 Hz.

The significance of the frequency $f_b$ is apparent in FIG. 8, which is a graph illustrating the current that a typical magnetic phono cartridge will deliver into a low-impedance load as a function of frequency. Above $f_b$, the current output of the magnetic phono cartridge decreases with frequency at a rate of 6 dB/octave (20 dB/decade).

Indeed, if the magnetic phono cartridge were operated into a basic virtual-ground preamplifier comprising a simple resistive feedback element, such as is shown in FIG. 6, the frequency response of the system would be as shown in FIG. 8. Of course, in this situation, the ordinate (in FIG. 8) would be voltage output of the amplifier A1, rather than the current supplied by the magnetic phono cartridge.

As can be seen from the drawing, the arrangement of FIG. 6 includes the magnetic phono cartridge, depicted by its resistance 10 and inductance 11, together with cable capacitance 12, driving the inverting input of an amplifier A1, having a simple feedback resistor 24 connected output-inverting input.

The arrangement of FIG. 6 is a simple current-to-voltage converter, and because of the effects of inductance 11 of the magnetic phono cartridge, output voltage will drop at a 6 dB/octave (20 dB/decade) rate above the characteristic frequency $f_b$, determined by inductance 11 and resistance 10 of the magnetic phono cartridge.

Figure 9:
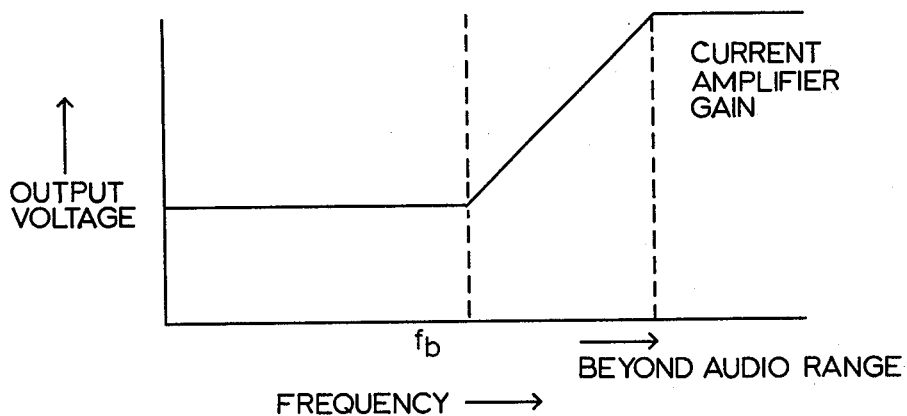
FIG. 9 is a graph showing the desired frequency response of an amplifier which, in combination with the frequency response characteristic illustrated in FIG. 8 (i.e., the short-circuit current output vs. frequency for the magnetic phono cartridge) will produce a substantially flat overall frequency response in the audio range. The characteristic of FIG. 9 is a response which increases at a rate of 6 dB/octave (20 dB/decade) over a certain range of frequencies. The characteristic of FIG. 9 can be approximated by any of the circuits illustrated in FIGS. 2, 3, and 4.
Figure 10:
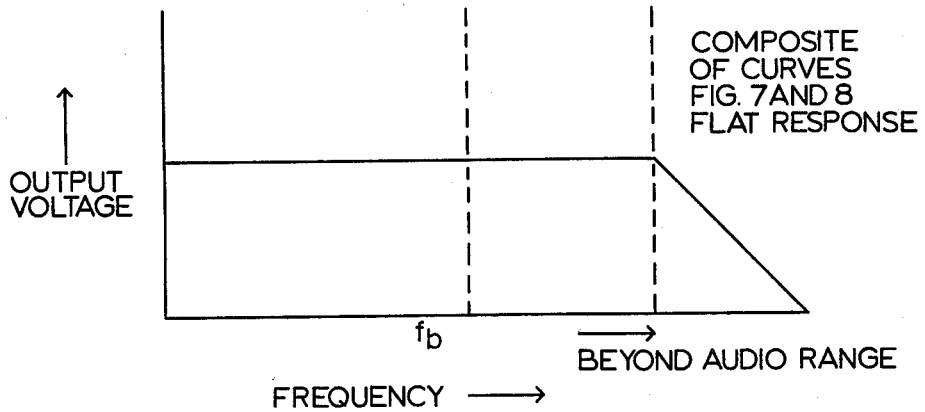
FIG. 10 is a graph showing the composite frequency response of the cascaded combination of the magnetic phono cartridge (having characteristics illustrated in FIG. 8) and the preamplifier (having frequency response characteristics illustrated in FIG. 9).
Figure 11:
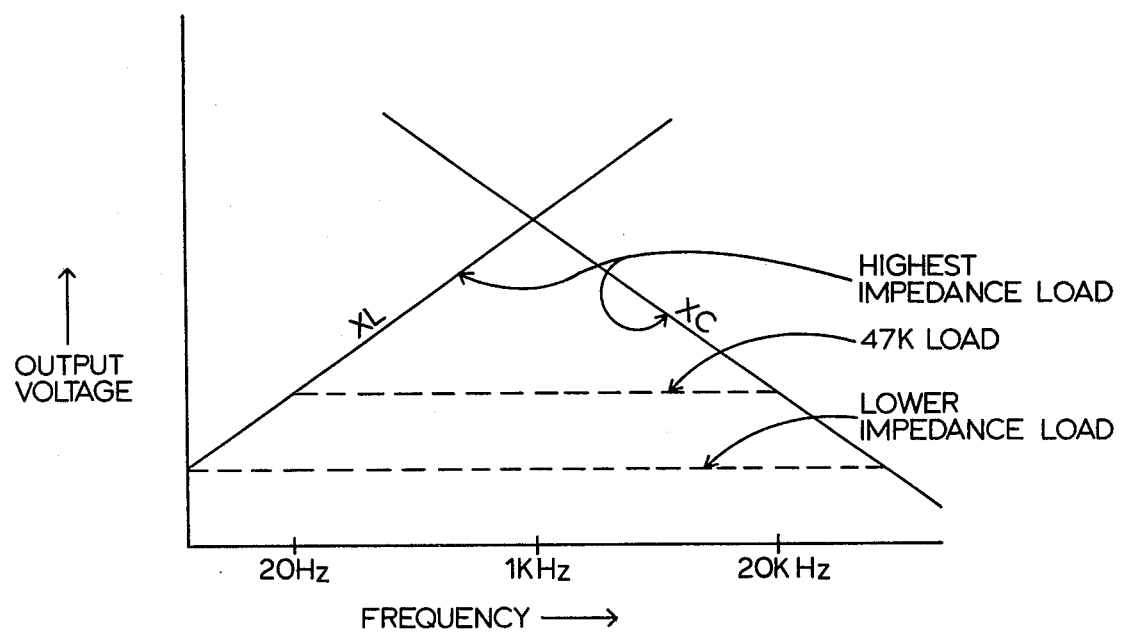
FIG. 11 is a graph showing the output voltage amplitude versus frequency of a magnetic phono cartridge for different values of resistive loads.

FIG. 9 is a graph showing the required transfer function (magnitude) which, when connected in cascade with the arrangement of FIG. 6 having the frequency response characteristic shown in FIG. 8, will produce a substantially flat overall frequency response, as shown in FIG. 10.

Figure 3:
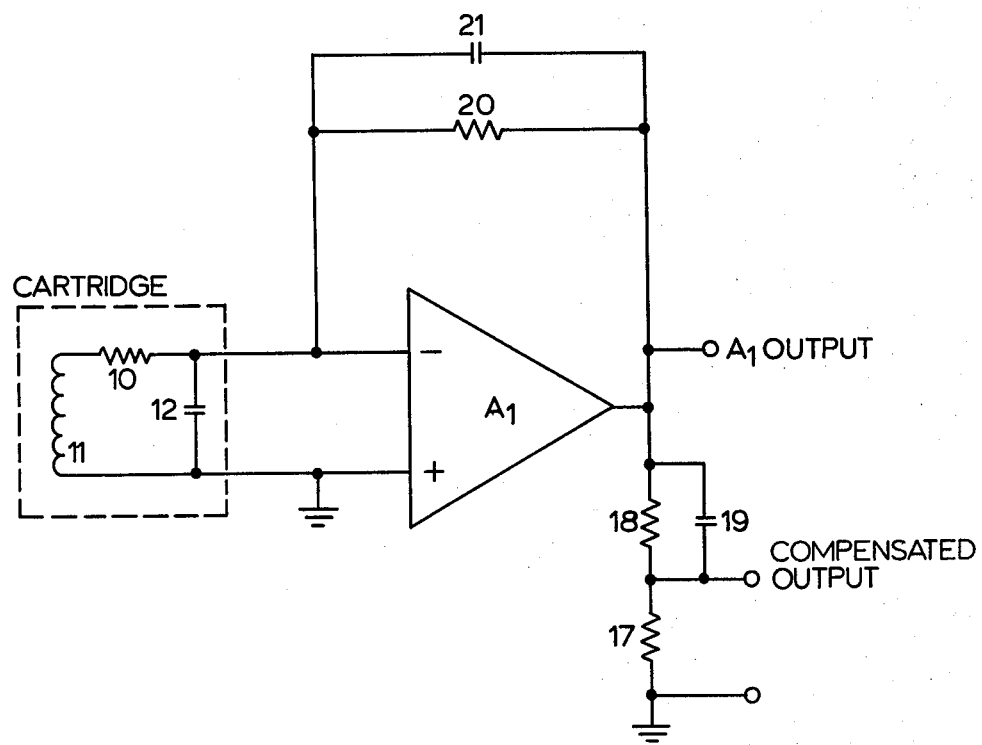
FIG. 3 is an electrical schematic diagram of a second embodiment, the preferred embodiment of the invention, which incorporates a compensation network comprising a passive highpass filter at the output of amplifier A1. Here again, amplifier A1 may be the wideband inverting amplifier of FIG. 1, or a suitable integrated circuit operational amplifier. As in FIG. 2, the magnetic phono cartridge is represented by its equivalent resistance 10 and inductance 11, and capacitor 12 represents cable capacitance.
Figure 4:
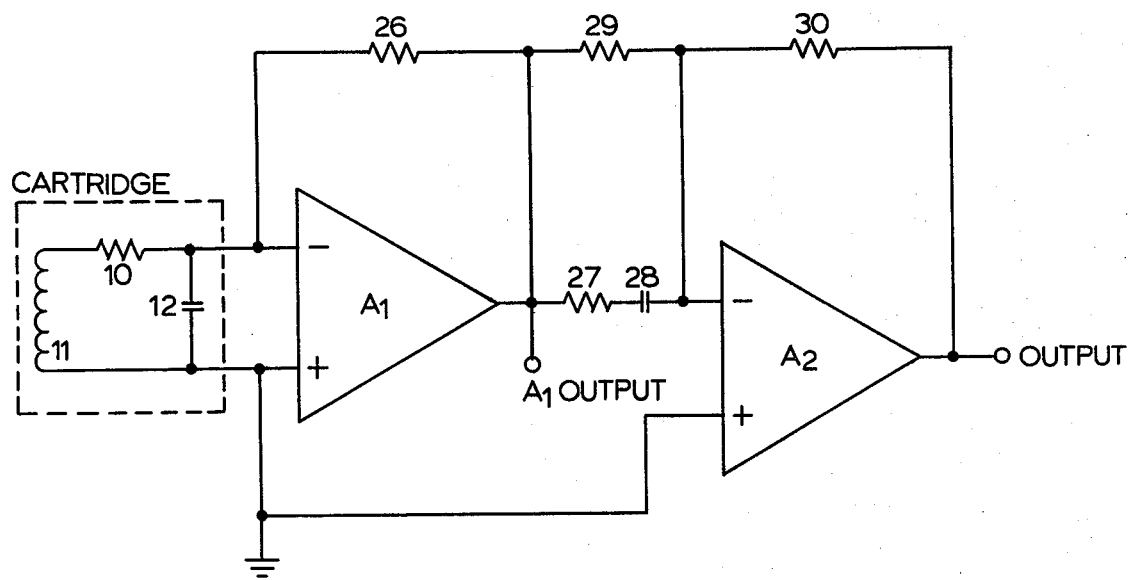
FIG. 4 is an electrical schematic diagram of a third embodiment of the invention. The embodiment of FIG. 4 is similar to that of FIG. 3, except that frequency compensation is effected by means of an active filter comprising operational amplifier A2 and its associated passive components (resistors 27, 29, 30, and capacitor 28) which are arranged in a highpass, or "differentiator," connection.

The circuits of FIGS. 2, 3 and 4, all operate in slightly different ways to implement the frequency response characteristic of FIG. 9 for compensating the intrinsic magnetic phono cartridge response of FIG. 8, to produce the composite, substantially flat frequency response of FIG. 10. In each case, the characteristic frequency $f_b$ of the magnetic phono cartridge must be determined in order to fix the values of various electrical components in the circuits of FIGS. 2, 3, and 4.

In the circuit of FIG. 2, the first embodiment of the invention, the method of choosing the value of capacitor 15 is as follows. As was described previously, resistors 13 and 14 are selected to have equal values, and so that their sum is equal to the resistance 10 of the magnetic phono cartridge. These criteria lead to the following relation:

$$R_{13} = R_{14} = R_{10}/2, \quad (2)$$

where $R_{13}$ represents resistor 13, $R_{14}$ represents resistor 14, and $R_{10}$ represents the equivalent resistance 10 of the magnetic phono cartridge.

With resistor 13 and resistor 14 determined, it then becomes possible to choose the value of capacitor 15 so that it "breaks" with the parallel combination of resistor 13 and resistor 14 at substantially the same frequency $f_b$ as is determined by the resistance 10 and inductance 11 of the magnetic phono cartridge, so $$C_{15} = \left[ 2\pi f_b \frac{R_{13} R_{14}}{R_{13} + R_{14}} \right]^{-1}, \quad (3)$$

where $C_{15}$ represents the capacitor 15.

Combining equations (1), (2), and (3), we obtain the following relation for capacitor 15:

$$C_{15} = 4 \frac{L_{11}}{R_{10}^2}. \quad (4)$$

Thus, for the Shure V15, type III magnetic phono cartridge utilized in the first embodiment of the invention illustrated in FIG. 2, the following component values are determined to be appropriate:

| Designation | Description | Value |
| --- | --- | --- |
| 10 | Resistance, magnetic phono cartridge | 1.35 k ohms |
| 11 | Inductance, magnetic phono cartridge | 500 mH |
| 13 | Resistor | 675 ohms |
| 14 | Resistor | 675 ohms |
| 15 | Capacitor | 1.096 μF |

The tee network comprising resistor 13, capacitor 15, and resistor 14, results in an overall frequency response characteristic of the preamplifier (current input to voltage output) which is substantially identical to that shown in the graph of FIG. 9. Note that the preamplifier transfer function has the units of "impedance" (volts/ampere), and it is substantially determined by the tee network in shunt with the inverting input of Amplifier A1. Hence, it is appropriate to refer collectively to these components, and to the analogous components in the circuits of FIGS. 3, 4, 5, and 6, as a "shunt feedback transimpedance network."

In FIG. 2, capacitor 16 is included to limit high-frequency response above the audio band, and to produce critical damping of the square wave response without imposing any undue limitation on overall bandwidth.

It may also be desirable to include a resistor (not shown in FIG. 2) in series with capacitor 15 in order to minimize or eliminate any tendency of the circuit to "peak" at the frequency where the (falling) open-loop frequency response intersects the (rising) closed-loop frequency response.

In the preceding discussion, the effects of cable capacitance 12 have been neglected. These effects may become significant at some relatively high frequency but, by good design (i.e., by locating the amplifier A1 as close as practical to the magnetic phono cartridge), the influence of cable capacitance 12 can be made negligible up to some relatively high frequency well above the audio range of frequencies. It is expecially important to note that the shunt feedback arrangement of FIG. 2 (and FIGS. 3, 4, 5, and 6) presents the magnetic phonograph cartridge with a relatively low load impedance, and thereby minimizes the effects of cable capacitance 12 (as compared with the corresponding effects in a conventional circuit, in which the cartridge is loaded by a 47k ohm resistor).

The circuit arrangement of FIG. 3 represents the preferred embodiment of the present invention. In FIG. 3, there is shown resistance 10 of the magnetic phono cartridge, inductance 11 of the magnetic phono cartridge, and capacitor 12, representing the capacitance of the cable connecting the magnetic phono cartridge to the amplifier A1. The shunt feedback transimpedance network in FIG. 3, consists of resistor 20 and capacitor 21, connected in parallel between the output and the inverting input of amplifier A1, which may be the amplifier of FIG. 1, or a conventional operational amplifier. The compensated output of the preamplifier according to FIG. 3 is taken from an attenuator/highpass filter consisting of resistor 18, capacitor 19, and resistor 17.

In the upper audio frequency range, before the effects of cable capacitance 12 and capacitor 21 are manifest, the frequency response of the magnetic phono cartridge and preamplifier combination of FIG. 3, up to the node designated "A1 OUTPUT," can be thought of as a simple lowpass. If the ordinate of FIG. 8 is thought of as the ratio of the voltage appearing at the node designated "A1 OUTPUT" relative to the Thevenin equivalent open-circuit voltage of the magnetic phono cartridge, then FIG. 8 can be considered to represent this lowpass frequency response. Again, the frequency designated $f_b$ in FIG. 8 is determined by the resistance 10 and inductance 11 of the magnetic phono cartridge.

Effectively, the attenuator/highpass filter network consisting of resistor 17, resistor 18, and capacitor 19, serves to compensate (over a limited range of frequencies) the lowpass frequency response characteristic of the portions of the circuit which precede it. At dc and low frequencies, the network functions as a simple voltage divided. Capacitor 19 is chosen to produce a frequency response characteristic similar to that shown in FIG. 9, with the lower "break" frequency occurring at $f_b$. It is apparent, from FIG. 3, that the attenuator/highpass filter network consisting of resistor 17, resistor 18, and capacitor 19, is capable of providing the requisite compensation over only a limited frequency range. At some high frequency, the voltage appearing at the node "A1 OUTPUT" will also appear at the output of the highpass filter, the node designated "compensated output," and no further high frequency compensation is available. As a practical matter, the network is capable of providing suitable compensation over the range of frequencies required for superb audio reproduction.

This approach, and the analogous arrangements in FIGS. 2 and 4, are a form of "pole-zero cancellation," in which a zero (provided by the highpass filter) effectively cancels the undesired pole (the lowpass characteristic resulting from the L/R characteristic of the magnetic phono cartridge).

In the circuit of FIG. 3, the resistor 20 is chosen for a voltage gain (the ratio of A1 output to the Thevenin equivalent open-circuit voltage of the magnetic phono cartridge) of approximately unity at 100 kHz. Because of the 6 dB/octave characteristic previously described, this choice results in a voltage gain (to the output of amplifier A1) of approximately five at 20 kHz, thereby providing good transient response and signal-to-noise ratio.

It is possible, of course, to choose resistor 20 for a lower voltage gain. However, in this situation, the electrical noise of subsequent amplifier stages may become a significant factor in determining overall signal-to-noise ratio of the system. It is this consideration which dictates the selection of a voltage gain of unity at 100 kHz.

Therefore, as will be understood by those skilled in the art, the value of resistor 20 is selected to be approximately equal to the inductive reactance at 100 kHz of the inductance 11 of the magnetic phono cartridge, as set forth below:

$$R_{20} = 2\pi(10^5)L_{11}, \tag{5}$$

where $R_{20}$ is the value of resistor 20, and $L_{11}$ is the inductance 11 of the magnetic phono cartridge. In the case of the Shure V15, type III magnetic phono cartridge, we obtain a value of 314K ohms for resistor 20 in the preferred embodiment of FIG. 3.

The values of resistor 17 (R17) and resistor 18 (R18) in the highpass filter are not critical. It is convenient to choose the ratio R17/R18 to be equal to the ratio R10/R20. This criterion leads to a choice of values, in the present instance, as follows:

$$R_{17} = 1.35k \text{ ohms} \tag{6}$$

$$R_{18} = 314k \text{ ohms} \tag{7}$$

The frequency $f_b$ is calculated as previously described in equation (1). The value of capacitor 19 (C19) is then chosen to "break" with resistor 18 (R18) at the frequency $f_b$, in accordance with the following relation:

$$C_{19} = 1/2\pi f_b R_{18}. \tag{8}$$

This relation results, in the present instance, in a value of 1.18 nF for the value of capacitor 19.

As previously discussed, an additional capacitor 21 may be included in the shunt feedback transimpedance network to provide a critically damped square wave response. The value of capacitor 21 is best chosen by experiment.

FIG. 4 illustrates a third embodiment of the invention which is similar to the second embodiment shown in FIG. 3. The arrangement of FIG. 4 differs from that of FIG. 3 in that frequency compensation of the inductance 11 and resistance 10 of the magnetic phono cartridge is accomplished by an active highpass filter, as distinguished from the passive attenuator/highpass filter of FIG. 3.

In particular, in FIG. 4, operational amplifier A2, together with the summing network comprising resistor 27, capacitor 28, and resistor 29, and the feedback network comprising resistor 30, serves as an active, inverting, highpass filter having a voltage transfer function of the same form as the transfer function illustrated in FIG. 8. The active filter, in FIG. 4, provides a substantially flat low- and mid-frequency gain, followed by a range of frequencies in which the voltage gain increases at a rate of 6 dB/octave (20 dB/decade), followed by third range of frequencies (above the audio frequency range) in which voltage gain versus frequency is constant.

The component values in the circuit of FIG. 4 may conveniently be chosen as follows. Resistor 26 is selected so that the voltage gain (from the Thevenin open-circuit equivalent voltage of the magnetic phono cartridge to the output of amplifier A1) is approximately unity at 100 kHz. Under this criterion, the resistance of resistor 26 is equal to the inductive reactance, at 100 kHz, of inductance 11 of the magnetic phono cartridge.

$$R_{26} = 2\pi(10^5)L_{11}. \tag{9}$$

In the case of the Shure V15, type III cartridge, for which inductance 11 is of the order of 500 mH, resistor 26 is found to have a value of 314k ohms. Resistor R29 and resistor R30, which determine the low frequency gain of the active highpass filter, are chosen to have the same ratio as the ratio of resistor 26 to resistance 10 of the magnetic phono cartridge. In other words, $$\frac{R_{30}}{R_{29}} = \frac{R_{10}}{R_{26}}. \tag{10}$$

For the Shure V15, type III magnetic phono cartridge, this condition results in a selection of 1.35k ohms for R30, and 314k ohms for R29. Operational amplifier A2 thus provides, at low frequencies, a fractional voltage amplification that is equal to the reciprocal of the low frequency voltage amplification of the first amplifier stage comprising A1.

Capacitor 28 is selected to have a capacitive reactance, at the frequency $f_b$, that is equal to the resistance of resistor 29, so the active highpass filter comprising amplifier A2 exhibits a rising 6 dB/octave (20 dB/decade) frequency response characteristic commencing at the frequency $f_b$. Thus, the following relation is obtained for capacitor 28:

$$C_{28} = 1/2\pi f_b R_{29} \tag{11}$$

Thus, for the Shure V15, type III magnetic phono cartridge, we obtain a value of 1.18 nF for capacitor 28.

In the embodiment of FIG. 4, resistor 27 serves to limit the high-frequency response of the active highpass filter. The value of resistor 27 is not critical, and it may be chosen to be equal to the value of resistor 30, resulting in a voltage gain of approximately one at very high frequencies (well above the audio range).

Figure 5:
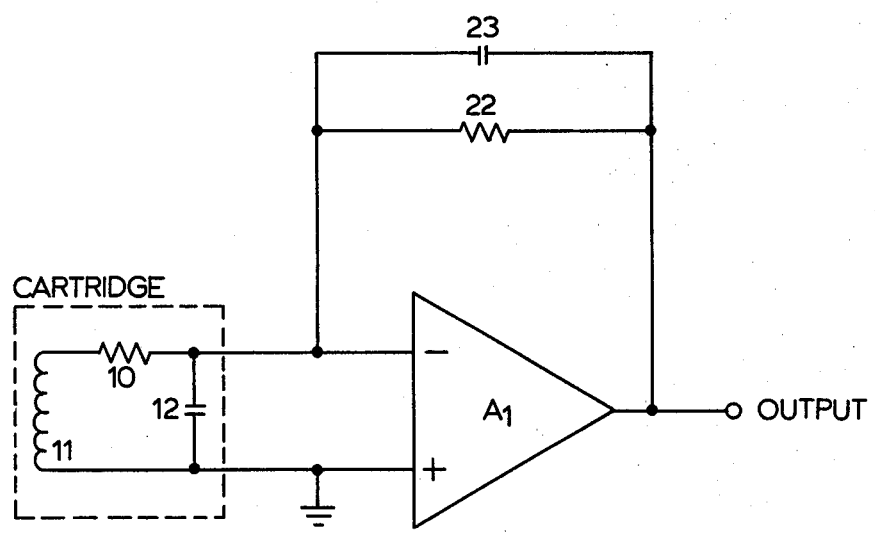
FIG. 5 is an electrical schematic diagram of a fourth embodiment of the invention especially suited for use with low-impedance moving soil type magnetic phono cartridges.

FIG. 5 shows a fourth embodiment of the present invention that is especially well suited for low impedance type magnetic phono cartridges, such as moving coil types. The circuit arrrangement of FIG. 5 is a basic current-to-voltage convertor, or transimpedance amplifier, which presents a relatively low load impedance to the magnetic phono cartridge, again represented by its equivalent inductance 11 and resistance 10. Capacitor 12 again represents the unavoidable parasitic capacitance present in any cable connecting the magnetic phono cartridge to the phono preamplifier.

In the circuit arrangement of FIG. 5, resistor 22 is selected to provide the desired voltage gain G, in accordance with equation 12:

$$R_{22} = GR_{10}. \qquad (12)$$

A typical value for resistor 22, for use with a moving coil type magnetic phono cartridge, might be 1k ohm. With this choice of values, and assuming that resistance 10 of the moving coil magnetic phono cartridge is of the order of 30 ohms, the voltage gain G of the magnetic phono cartridge-preamplifier combination will be equal to about 33.

With the moving coil type magnetic phono cartridge, it is usually possible to neglect the effects of the reactance of inductance 11 of the magnetic phono cartridge. This is possible because (in this type of magnetic phono cartridge) the L/R characteristic frequency $f_b$, defined in equation (1), is typically well above the audio range of frequencies.

For example, a typical low impedance, a moving coil type magnetic phono cartridge might have a resistance 10 of 30 ohms, and an inductance 11 of 10 uH, resulting in $$f_b = 477 \text{ kHz}. \qquad (13)$$

In all of the preceding description of the invention, the amplifier designated A1 in FIGS. 2, 3, 4, and 5, has been treated as a mere component of the preamplifier. In fact, a conventional monolithic, hybrid, or discrete-type operational amplifier may be used for amplifier A1. However, for best performance, the amplifier A1 should be designed with several characteristics, or features, which differ from the corresponding characteristics or features of a conventional operational amplifier.

In particular, amplifier A1 is preferably designed for low intrinsic input impedance, unlike conventional operational amplifiers which are usually designed to present an intrinsic input impedance that is as high as possible. Moreover, because certain of the shunt feedback transimpedance networks, such as the bridged tee feedback network comprising resistor 13, resistor 14, capacitor 15, and capacitor 16, in the embodiment of FIG. 2, may not be "well-behaved," it is in some cases desirable to provide a forward transfer function characteristic that differs substantially from the canonical 6 dB/octave (20 dB/decade) characteristic of the conventional operational amplifier.

Figure 1:
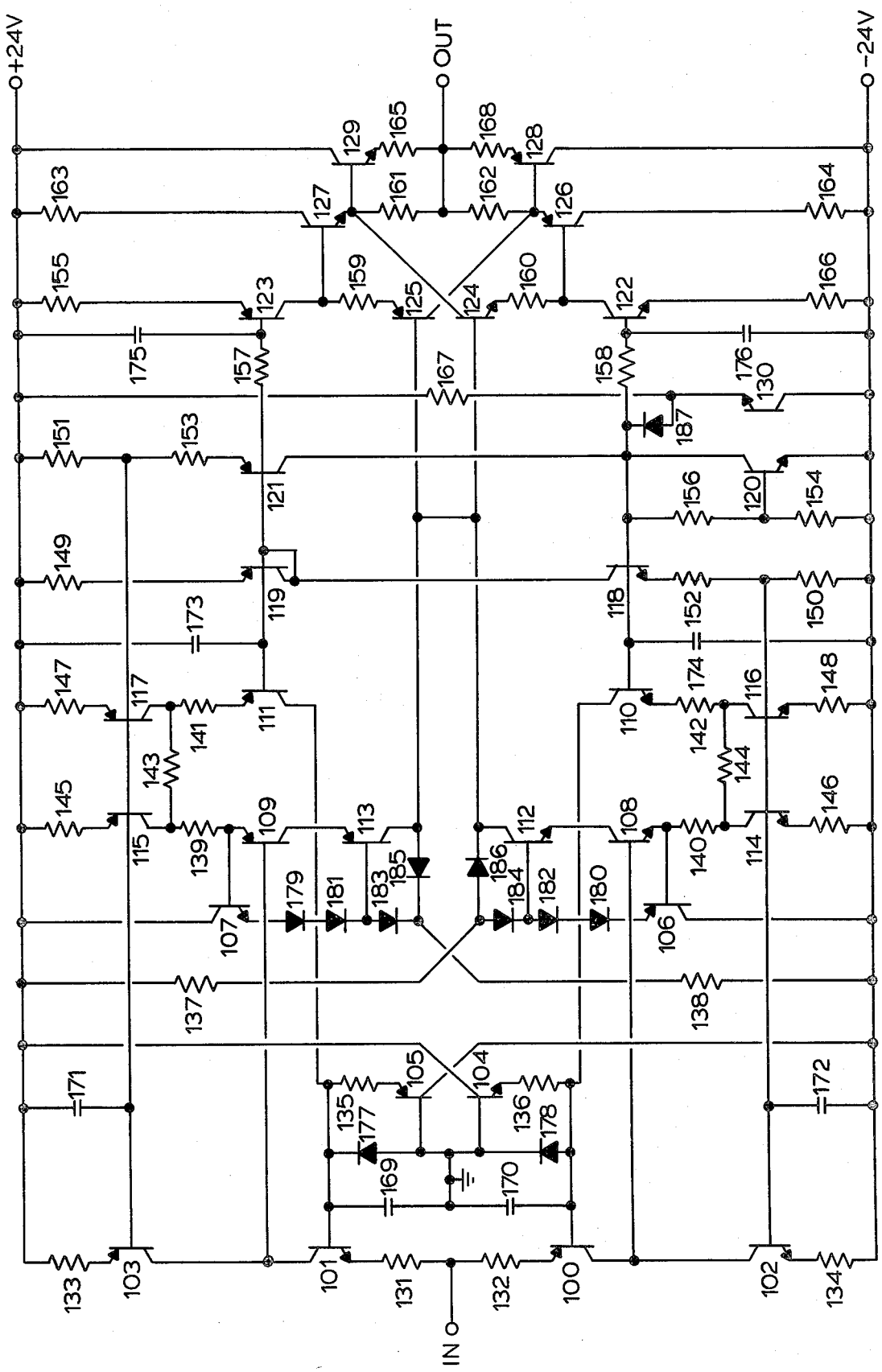
FIG. 1 is an electrical schematic diagram of a wideband, complementary symmetry inverting amplifier having very low (open loop) input impedance, good linearity, and good overload recovery. The amplifier of FIG. 1 is well suited for service in the forward path of a phono preamplifier according to the present invention.

Illustrated in FIG. 1 is the schematic diagram of an amplifier that is well-suited to in any of the embodiments of FIGS. 2, 3, 4, 5, and 6. Note that this amplifier presents a relatively low intrinsic input impedance (i.e., a relatively low open loop input impedance) to the terminal designated "IN," which serves as the inverting input.

The non-inverting input of the amplifier of FIG. 1 is connected to circuit common ("ground") via capacitors 169, 170, diodes 177, 178, bipolar junction transistors 104, 105, and resistors 135, 136.

The amplifier of FIG. 1 comprises a common-base, complementary symmetry input stage followed by a complementary symmetry second stage which operates into a cascode. Both the input stage and the second stage are provided with current-source loads to produce very high low-frequency open-loop voltage gain.

Voltage gain of each stage is also increased by the technique of "bootstrapping," which minimizes the loading effects of each subsequent stage on the voltage gain of the preceding stage.

PNP transistor 100 and NPN transistor 101, together with resistors 131 and 132 and the other associated components, constitute the complementary-symmetry common-base input stage. The voltage gain of this stage is largely determined by resistors 131 and 132. The common-base input configuration serves to provide low intrinsic (i.e., open-loop) input impedance and very good high-frequency response.

NPN transistor 102, and PNP transistor 103, and their associated passive components, serve as constant current collector loads for PNP transistor 100 and NPN transistor 101, respectively. The use of these constant-current collector loads provides high open-loop voltage gain.

NPN transistors 108 and 110, on the one hand, and PNP transistors 109 and 111, on the other hand, form symmetrical complemenetary differential amplifier stages, with inputs fed from the outputs of common-base stages 100 and 101, respectively.

NPN transistor 108 feeds cascode NPN transistor 112, and PNP transistor 109 feeds cascode PNP transistor 113. The cascode arrangement provides improved high frequency response and minimizes the deleterious effects of collector-base capacitance in NPN transistor 108 and PNP transistor 109. In this way, high-frequency loading effects on the output of PNP transistor 100 and NPN transistor 101 are minimized.

PNP transistor 106 serves to couple the voltage signal existing at the emitter of NPN transistor 108, via silicon diodes 180 and 182, to the base of NPN transistor 112. This "feedforward" path bootstraps the base and emitter of NPN transistor 112 to the voltage signal appearing at the base of NPN transistor 108, thereby reducing even further the effects of collector-base capacitance of NPN transistor 108. The corresponding components of the complenmentary-symmetry stage are NPN transistor 107, silicon diodes 179 and 181, and PNP transistor 113.

Overload recovery is faciitated by diode 186, which, together with diode 184, serves to clamp large signal excursions and prevent saturation (i.e., forward bias of the collector-base junction) of NPN transistor 112. In this arrangement, diode 184 is always forward-biased, and operates as a voltage translator, or "level shifter". Diodes 185 and 183 perform a similar function for the complementary-symmetry device, PNP transistor 113.

The amplifier of FIG. 1 incorporates emitter degeneration in all gain stages for improved open-loop linearity and gain stability. In the differential stage comprising NPN transistors 108 and 110, and resistors 140, 142, and 144, for example, the use of emitter degeneration further enhances open-loop linearity. Typically, emitter degeneration resistors 140 and 142 are selected to be twice the value of the incremental, or Schockley, resistance of the emitter. The value of resistor 144 can then be chosen to provide the desired voltage gain.

The voltage output of the amplifier of FIG. 1 is developed at the collectors of NPN transistor 112 and PNP transistor 113, which is the point at which the signals are recombined after having traversed the two complementary-symmetry paths.

NPN transistor 124 and PNP transistor 125 provide a first stage of complementary emitter-follower current amplification. Their emitters are fed from current sources comprising NPN transistor 122 (and its associated passive components) and PNP transistor 123 (and its associated passive components).

The output of the first complementary emitter follower stage is applied to the bases of the following complementary emitter follower stage, comprising PNP transistor 126 and NPN transistor 127, and their associated passive components. Note that the collectors of the first complementary emitter follower stage are cross-connected to the emitters of the second complementary emitter follower stage, thereby bootstrapping the first-stage collectors with substantially the same signal voltages as appear at their bases and emitters.

Returning now to the input and second stages of the amplifier of FIG. 1, it can be seen that the collector of NPN transistor 110 supplies current to resistor 136 and the emitter of common-base connected NPN transistor 104. The voltage developed across resistor 136 (and the emitter of NPN transistor 104) is applied to the base of PNP transistor 100. This arrangement provides a negative-feedback path for stabilizing the standing current in PNP common-base transistor 100. Capacitor 170 bypasses audio-frequency signals, so the feedback is ineffective over the frequency range of interest.

PNP transistor 111, resistor 135, PNP transistor 105, and capacitor 169, perform similar roles in the complementary-symmetry stage, serving to maintain a preset bias current in NPN common-base transistor 101.

Resistor 144, in the lower second differential gain stage, serves to limit and stabilize voltage gain. Resistors R140 and R142 also degenerate this stage, and equalize dc operating current levels in NPN transistors 108 and 110.

The corresponding components in the complementary-symmetry stage comprising PNP transistors 109 and 111, are resistor 143, and resistors 139 and 141.

NPN transistor 120, together with resistors 154 and 156, form a "$V_{be}$ muliplier" circuit which serves as voltage reference for the constant current source comprising NPN transistor 118 and its associated passive components. PNP transistor 121 is also a current source, providing current to the "$V_{be}$ multiplier" circuit. The current source of PNP transistor 121 is, in turn, referenced to the current produced by the current source comprising NPN transistor 118 and its associated passive components. It will be noted that PNP transistor 119 is connected to compensate the base-emitter junction characteristics of PNP transistor 121.

There is positive feedback around this loop consisting of NPN transistor 120, NPN transistor 118, and PNP transistor 121. To cause the reference circuit to "start" when electrical power is applied, NPN transistor 130 is connected as a Zener diode, which produces a voltage that is coupled through silicon diode 187 to turn on the $V_{be}$ multiplier, comprising NPN transistor 120. When the current reference circuit is in operation, silicon diode 187 is reverse-biased, and current levels are determined by the $V_{be}$ multiplier arrangement alone.

It can be seen, from the schematic circuit diagram of FIG. 1 and the component values listed in the tabular summary, infra, that the complementary-symmetry common-base-connected junction transistor input stage comprising PNP transistor 100 and NPN transistor 101 operates with a dc emitter current sufficiently high that the intrinsic input impedance of the amplifier is substantially determined by resistors 131 and 132. In the example of FIG. 1, the resultant intrinsic input impedance in the audio range of frequencies is of the order of 100 ohms.

A full and complete understanding of the amplifier of FIG. 1 can be obtained, by those skilled in the art, from the schematic diagram of FIG. 1, the preceding description, and the following tabulation of typical components and their values.

| Component Designation | Description |
|---|---|
| 100 | Transistor, PNP silicon, 2N4250 |
| 101 | Transistor, NPN silicon, TIS97 |
| 102 | Transistor, NPN silicon, TIS97 |
| 103 | Transistor, PNP silicon, 2N4250 |
| 104 | Transistor, NPN silicon, TIS97 |
| 105 | Transistor, PNP silicon, 2N4250 |
| 106 | Transistor, PNP silicon, 2N4250 |
| 107 | Transistor, NPN silicon, TIS97 |
| 108 | Transistor, NPN silicon, TIS97 |
| 109 | Transistor, PNP silicon, 2N4250 |
| 110 | Transistor, NPN silicon, TIS97 |
| 111 | Transistor, PNP silicon, 2N4250 |
| 112 | Transistor, NPN silicon, TIS97 |
| 113 | Transistor, PNP silicon, 2N4250 |
| 114 | Transistor, NPN silicon, TIS97 |
| 115 | Transistor, PNP silicon, 2N4250 |
| 116 | Transistor, NPN silicon, TIS97 |
| 117 | Transistor, PNP silicon, 2N4250 |
| 118 | Transistor, NPN silicon, TIS97 |
| 119 | Transistor, PNP silicon, 2N4250 |
| 120 | Transistor, NPN silicon, TIS97 |
| 121 | Transistor, PNP silicon, 2N4250 |
| 122 | Transistor, NPN silicon, TIS97 |
| 123 | Transistor, PNP silicon, 2N4250 |
| 124 | Transistor, NPN silicon, TIS97 |
| 125 | Transistor, PNP silicon, 2N4250 |
| 126 | Transistor, PNP silicon, 2N4250 |
| 127 | Transistor, NPN silicon, TIS97 |
| 128 | Transistor, PNP silicon, 2N4250 |
| 129 | Transistor, NPN silicon, TIS97 |
| 130 | Transistor, NPN silicon, TIS97 |
| 131 | Resistor, ⅛ watt metal film, 174 ohm |
| 132 | Resistor, ⅛ watt metal film, 174 ohm |
| 133 | Resistor, ⅛ watt metal film, 1 k ohm |
| 134 | Resistor, ⅛ watt metal film, 1 k ohm |
| 135 | Resistor, ⅛ watt metal film, 750 ohm |
| 136 | Resistor, ⅛ watt metal film, 750 ohm |
| 137 | Resistor, ⅛ watt metal film, 49.9 k ohm |
| 138 | Resistor, ⅛ watt metal film, 49.9 k ohm |
| 139 | Resistor, ⅛ watt metal film, 100 ohm |
| 140 | Resistor, ⅛ watt metal film, 100 ohm |
| 141 | Resistor, ⅛ watt metal film, 100 ohm |
| 142 | Resistor, ⅛ watt metal film, 100 ohm |
| 143 | Resistor, ⅛ watt metal film, 1 k ohm |
| 144 | Resistor, ⅛ watt metal film, 1 k ohm |
| 145 | Resistor, ⅛ watt metal film, 4.02 k ohm |
| 146 | Resistor, ⅛ watt metal film, 4.02 k ohm |
| 147 | Resistor, ⅛ watt metal film, 4.02 k ohm |
| 148 | Resistor, ⅛ watt metal film, 4.02 k ohm |
| 149 | Resistor, ⅛ watt metal film, 49.9 k ohm |
| 150 | Resistor, ⅛ watt metal film, 13.7 k ohm |
| 151 | Resistor, ⅛ watt metal film, 13.7 k ohm |
| 152 | Resistor, ⅛ watt metal film, 36.5 k ohm |
| 153 | Resistor, ⅛ watt metal film, 36.5 k ohm |
| 154 | Resistor, ⅛ watt metal film, 5.62 k ohm |
| 155 | Resistor, ⅛ watt metal film, 15 k ohm |
| 156 | Resistor, ⅛ watt metal film, 100 k ohm |
| 157 | Resistor, ⅛ watt metal film, 20 k ohm |
| 158 | Resistor, ⅛ watt metal film, 20 k ohm |
| 159 | Resistor, ⅛ watt metal film, 1 k ohm |
| 160 | Resistor, ⅛ watt metal film, 1 k ohm |
| 161 | Resistor, ⅛ watt metal film, 100 ohm |
| 162 | Resistor, ⅛ watt metal film, 100 ohm |
| 163 | Resistor, ⅛ watt metal film, 1 k ohm |
| 164 | Resistor, ⅛ watt metal film, 1 k ohm |
| 165 | Resistor, ⅛ watt metal film, 10 ohm |
| 166 | Resistor, ⅛ watt metal film, 15 k ohm |
| 167 | Resistor, ⅛ watt metal film, 100 k ohm |
| 168 | Resistor, ⅛ watt metal film, 10 ohm |
| 169 | Capacitor, polyester film, 3.3 μF |
| 170 | Capacitor, polyester film, 3.3 μF |

-continued

| Component Designation | Description |
| --- | --- |
| 171 | Capacitor, polyester film, 0.1 μF |
| 172 | Capacitor, polyester film, 0.1 μF |
| 173 | Capacitor, polyester film, 0.1 μF |
| 174 | Capacitor, polyester film, 0.1 μF |
| 175 | Capacitor, polyester film, 0.1 μF |
| 176 | Capacitor, polyester film, 0.1 μF |
| 177 | Diode, silicon, IN485B |
| 178 | Diode, silicon, IN485B |
| 179 | Diode, silicon, IN485B |
| 180 | Diode, silicon, IN485B |
| 181 | Diode, silicon, IN485B |
| 182 | Diode, silicon, IN485B |
| 183 | Diode, silicon, IN485B |
| 184 | Diode, silicon, IN485B |
| 185 | Diode, silicon, IN485B |
| 186 | Diode, silicon, IN485B |
| 187 | Diode, silicon, IN485B |

It will be understood by those skilled in the art that many modifications and variations from the present invention may be made without departing from the spirit and scope thereof.

What is claimed is:

1. A preamplifier for a magnetic phonograph cartridge having a characteristic impedance $L_p$, a characteristic resistance $R_p$, and a characteristic capacitance $C_p$, said preamplifier comprising:
   a. An amplifier means having an inverting input node and an output node for producing at the output node thereof an output voltage relative to circuit common, said amplifier having a complementary-symmetry input stage including a common-base-connected NPN transistor and a common-base-connected PNP transistor, said amplifier means further including emiter degeneration means for providing linearity and stability of voltage gain;
   b. shunt feedback transimpedance means electrically connecting said output node of said amplifier means to said inverting input node, said shunt feedback transimpedance means comprising a first resistive element $R_1$ and a first capacitive element $C_1$; and,
   c. a high pass filter means connected to said output node for providing an increasing voltage gain over a predetermined range of frequencies and a compensated voltage output
   wherein said high pass frequency characteristic of said high pass filter means over said predetermined range of frequencies substantially compensates for the low pass frequency characteristics of said magnetic phonograph cartridge over said predetermined range of frequencies so as to produce a substantially constant frequency response for said preamplifier over said predetermined range of frequencies.

2. The preamplifier of claim 1 wherein said shunt feedback transimpedance means comprises said first resistive element $R_1$ and said first capacitive element $C_1$ electrically connected in parallel with respect to each other.

3. The preamplifier of claim 2 wherein said high pass filter means comprises:
   a second resistive element $R_2$ connected at one end to the output node of said amplifier means;
   a third resistive element $R_3$ connected in series between said second resistive element and circuit common; and
   a second capacitive element $C_2$ connected in parallel across said second resistive element,
   wherein the compensated voltage output of said preamplifier is taken from the junction of said second and third resistive elements with respect to circuit common.

4. The preamplifier of claim 3 wherein the ratio of the characteristic resistance $R_p$ of said magnetic phonograph cartridge with respect to the said first resistive element $R_1$ is substantially equal to the ratio of resistance of said third resistive element $R_3$ with respect to said second resistive element $R_2$.

5. The preamplifier of claim 4 wherein the value of the first resistive element $R_1$ is approximately equal to the inductive reactance at 100 kHz of the characteristic inductance $L_p$ of said magnetic phonograph cartridge.

6. A preamplifier for a magnetic phonograph cartridge having a characteristic impedance $L_p$, a characteristic resistance $R_p$ and a characteristic capacitance $C_p$, said preamplifier comprising:
   a. A first amplifier means $A_1$ having an inverting input node and an output node, for producing at said output node an output voltage relative to circuit common;
   b. A first resistive element $R_1$ connecting said output node of said first amplifier means $A_1$ to said inverting input node of said first amplifier means $A_1$;
   c. A first capacitive element $C_1$ having one end thereof connected to said output node of said first amplifier means $A_1$;
   d. A second amplifier means $A_2$ having an inverting input node and an output node, for producing at said output node an output voltage relative to circuit common, said inverting input node of said second amplifier means $A_2$ being connected to the other end of said first capacitive element $C_1$
   e. A second resistive element $R_2$ connected between the output node of said first amplifer means $A_1$ and the inverting input node of said second amplifier means $A_2$; and,
   f. A third resistive element $R_3$ connected between the output node of said second amplifier means $A_2$ and the inverting input node of said second amplifier means $A_2$,
   wherein the active highpass characteristics of said preamplifier compensate for the low pass characteristics of said magnetic phonograph cartridge so as to produce a substantially linear output over the entire audio range of frequencies and wherein said preamplifier presents a relatively low load impedance to said magnetic phonograph cartridge, thereby effectively damping the mechanical resonance of said cartridge.

7. The preamplifier of claim 6 wherein the ratio of the third resistance $R_3$ to said second resistance $R_2$ is substantially equal to the ratio of the characteristic resistance $R_p$ of said phonograph cartridge with respect to the resistance of said first resistive element $R_1$.

8. The preamplifier of claim 7 wherein the capacitive reactance of said first capacitor $C_1$ is substantially equal to the resistance of said first resistive element $R_1$ at the break point frequency $f_b$ of the low pass filter characteristic of said magnetic phonograph cartridge.

9. The preamplifier of claim 8 wherein said first $A_1$ and second $A_2$ amplifier means include a complementary-symmetry input stage including a common-base-connected NPN transistor and a common-base-connected PNP transistor, said first $A_1$ and said second $A_1$ amplifier means further including emitter degeneration means for providing linearity and stability of voltage gain.

* * * * *